US006417048B1

(12) United States Patent
Tseng

(10) Patent No.: US 6,417,048 B1
(45) Date of Patent: Jul. 9, 2002

(54) METHOD FOR FABRICATING FLASH MEMORY WITH RECESSED FLOATING GATES

(75) Inventor: Horng-Huei Tseng, Hsinchu (TW)

(73) Assignee: Vanguard International Semiconductor Corporation (TW)

( * ) Notice: Subject to any disclaimer, the term of this patent is extended or adjusted under 35 U.S.C. 154(b) by 0 days.

(21) Appl. No.: 09/988,166

(22) Filed: Nov. 19, 2001

(51) Int. Cl.[7] .......................................... H01L 21/8247
(52) U.S. Cl. ..................... 438/259; 438/270; 438/589
(58) Field of Search ................................ 438/259, 263, 438/264, 270, 589

(56) References Cited

U.S. PATENT DOCUMENTS

| 5,229,312 A | * | 7/1993 | Mukherjee et al. .......... 438/259 |
| 6,084,265 A | * | 7/2000 | Wu .............................. 438/270 |
| 6,153,467 A | * | 11/2000 | Wu .............................. 438/259 |
| 2001/0046736 A1 | * | 11/2001 | Fu .............................. 438/259 |

FOREIGN PATENT DOCUMENTS

| JP | 64-53463 | * | 3/1989 |

* cited by examiner

Primary Examiner—Chandra Chaudhari
(74) Attorney, Agent, or Firm—Troxell Law Office PLLC

(57) ABSTRACT

The present invention discloses a method for fabricating a flash memory with recessed floating gates, comprising the steps of: providing a semiconductor substrate, on which a pad oxide layer and a first dielectric layer are formed in turn; patterning said first dielectric layer by anisotropic etching, so as to form a plurality of trenches for recessed floating gates; implanting ions into said semiconductor substrate, so as to define a plurality of bit line regions; filling said plurality of trenches for recessed floating gates by depositing a second dielectric layer, which is to be planarized by chemical mechanical polishing (CMP); removing said first dielectric layer; forming a plurality of trenches by etching by using said second dielectric layer as an etching mask; forming a tunnel dielectric layer on the top surface of said semiconductor substrate and said plurality of trenches; filling said plurality of trenches by depositing a first conductive layer, which is to be planarized by chemical mechanical polishing (CMP), so as to form recessed floating gates; depositing a third dielectric layer; depositing a second conductive layer; and patterning said second conductive layer, so as to form control gates.

19 Claims, 6 Drawing Sheets

METHOD FOR FABRICATING FLASH MEMORY WITH RECESSED FLOATING GATES

BACKGROUND OF THE INVENTION

1. Field of the Invention

The present invention generally relates to a method for fabricating a flash memory with recessed floating gates, and more particular, to a method for fabricating a more reliable flash memory characterized in that the bird beak is eliminated and the buried bit line region is uniformly doped.

2. Description of the Prior Art

The basic configuration of a flash memory, in general, is composed of two major portions: the memory cell array and the peripheral circuit. The memory cell array for data storage is constructed by a plurality of memory cells regularly arranged in an array based on the intersected word lines and bit lines. The peripheral circuit provides the flash memory with functions such as power supply and data processing during operation. Flash memories can be classified according to the gate electrode structures. In a flash memory with stacked control gates, a floating gate is capacitively coupled to a control gate that is stacked above it.

In the prior art, for example, the U.S. Pat. No. 6,084,265 discloses a high-density shallow trench contact less non-volatile memory. Please refer to FIG. 1 to FIG. 8, in which the method for fabrication is schematically illustrated. To begin with, there is provided a semiconductor substrate 2, on which a silicon oxide layer is formed as a pad oxide 4 and a silicon nitride layer 6 is formed as a mask for oxidation. By using a photoresist layer 8, the buried bit line region is defined by a standard photolithography process. An anisotropic etching follows to etch the silicon layer and then the n+impurity ions are implanted to form bit line regions 10 using the patterned photoresist 8 as a mask.

After stripping the photoresist layer 8, a high temperature steam oxidation process (also known as LOCal Oxidation of Silicon, LOCOS) is used to grow a thick field oxide 12 using the silicon nitride layer as a mask, and the doped ions are activated and driven in to form the buried bit lines 10 simultaneously. The masking silicon nitride layer 6 and the pad oxide layer 4 are then removed, and the silicon substrate 2 is recessed by using the field oxide 12 as an etching mask. After rounding the trench corners by using thermal oxidation and etching back processes, a thin silicon oxynitride film 14 is regrown over the substrate 2.

Finally, an insitu doped polysilicon film is deposited to refill the trench region and then etch back by using a chemical mechanical polishing (CMP) process to form the floating gates 16 adjacent to the buried bit lines.

However, it is transparent that the bird beak occurs during the formation of the field oxide 12 by the high temperature steam oxidation process (LOCOS), leading to a non-uniform doping in the doped bit line regions 10. On the other hand, the lateral diffusion due to the bird beak also irregularly reduces the effective width of the floating gates to be formed. Therefore, the prior art has the problems such as complexity in fabrication, low yield and high cost due to poor fabrication reliability.

Therefore, the present invention provides a method for fabricating a flash memory with recessed floating gates, which is used to overcome the problems in the prior art and improve, the reliability of the flash memory.

SUMMARY OF THE INVENTION

It is the primary object of the present invention to provide a method for fabricating a flash memory with recessed floating gates so that the bird beak is eliminated, the complexity in fabrication is reduced and the reliability is improved.

It is another object of the present invention to provide a method for fabricating a flash memory with recessed floating gates, in which a two-step trench formation process is employed so as to obtain uniformly doped buried bit line regions.

In order to achieve the foregoing objects, the present invention provides a method for fabricating a flash memory with recessed floating gates, comprising the steps of:

providing a semiconductor substrate, on which a pad oxide layer and a first dielectric layer are formed in turn;

patterning said first dielectric layer by anisotropic etching, so as to form a plurality of trenches for recessed floating gates;

implanting ions into said semiconductor substrate, so as to define a plurality of bit line regions;

filling said plurality of trenches for recessed floating gates by depositing a second dielectric layer, which is to be planarized by chemical mechanical polishing (CMP);

removing said first dielectric layer;

forming a plurality of trenches by etching by using said second dielectric layer as an etching mask;

forming a tunnel dielectric layer on the top surface of said semiconductor substrate and said plurality of trenches; and filling said plurality of trenches by depositing a first conductive layer, which is to be planarized by chemical mechanical polishing (CMP), so as to form recessed floating gates.

The present invention provides a method for fabricating a flash memory with recessed floating gates, further comprising the steps of:

depositing a third dielectric layer;

depositing a second conductive layer; and patterning said second conductive layer, so as to form control gates.

BRIEF DESCRIPTION OF THE DRAWINGS

The objects, spirits and advantages of the preferred embodiment of the present invention will be readily understood with reference to the accompanying drawings and detailed descriptions, wherein.

DETAILED DESCRIPTION OF THE INVENTION

Figure 1:
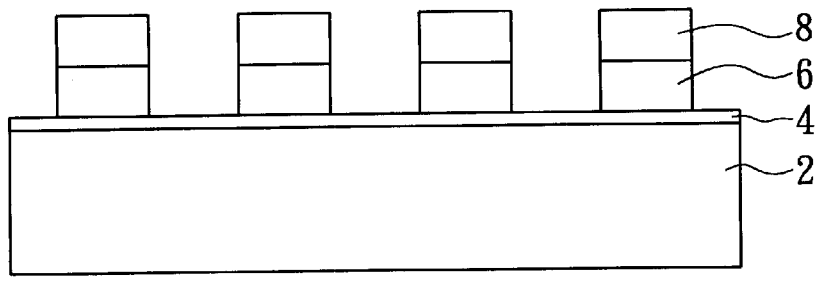
FIG. 1 to FIG. 8 schematically illustrates the method for fabricating a flash memory with recessed floating gates in accordance with the prior art.
Figure 2:
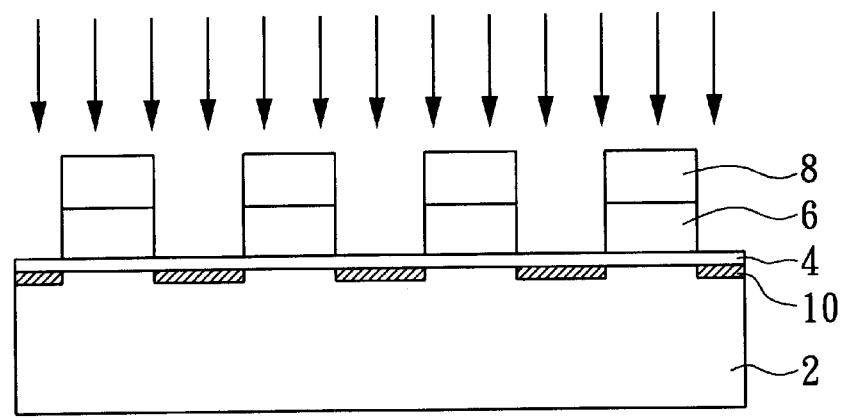
Figure 3:
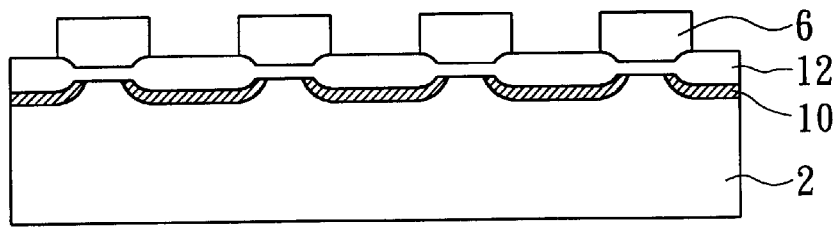
Figure 4:
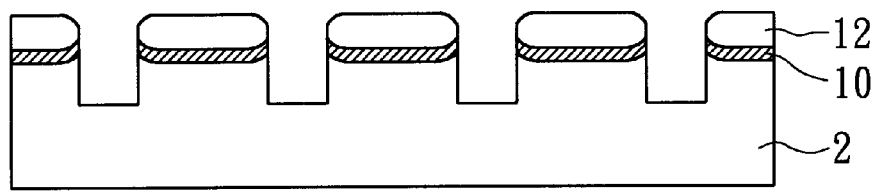
Figure 5:
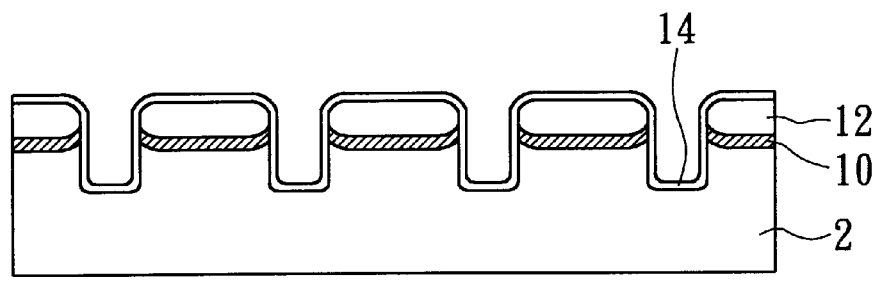
Figure 6:
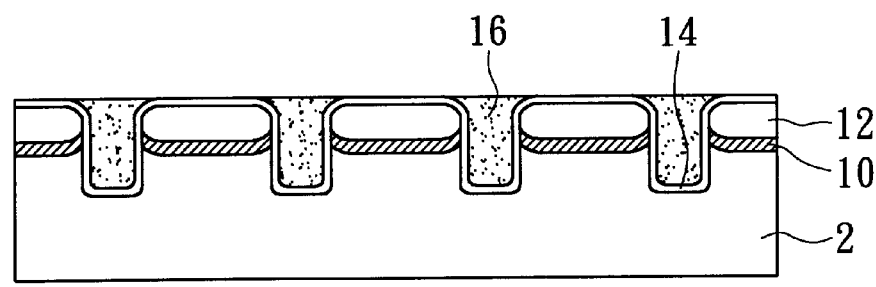
Figure 7:
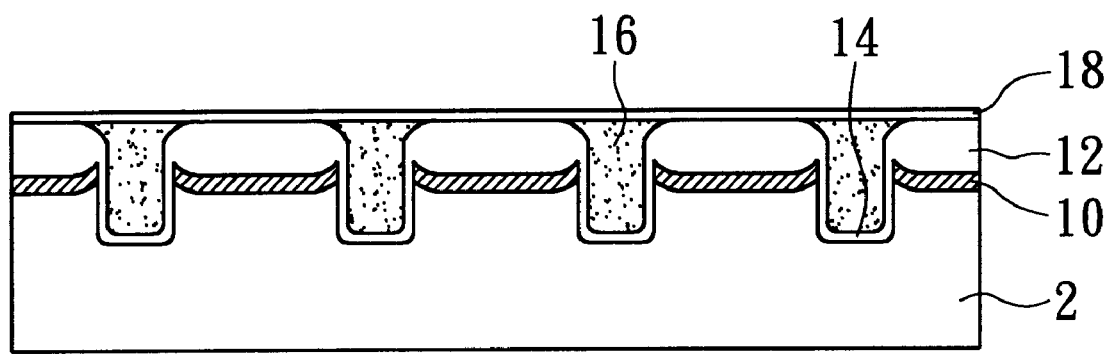
Figure 8:
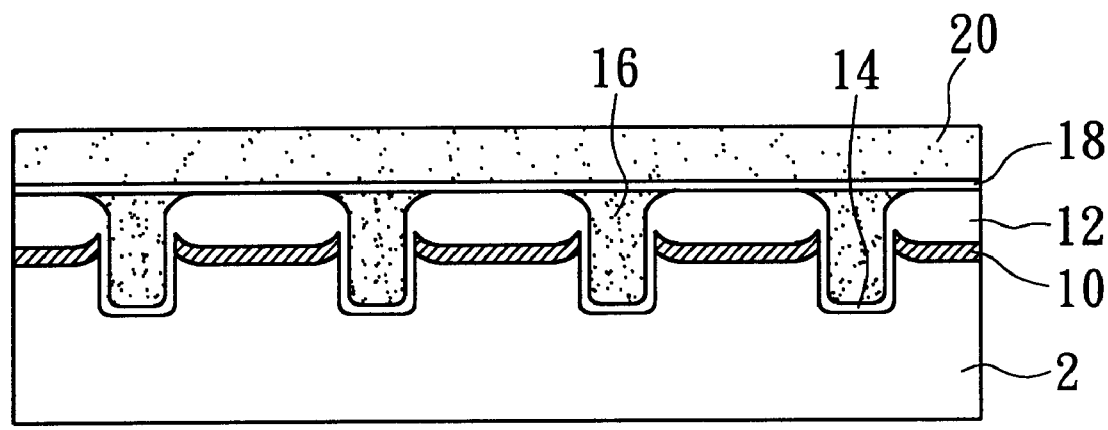
Figure 9:
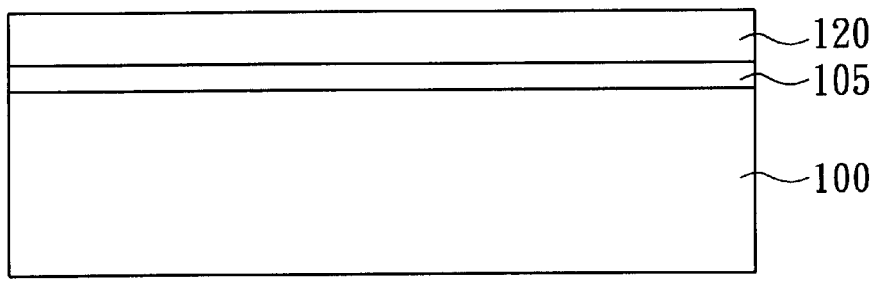
FIG. 9 schematically illustrates the step of "providing a semiconductor substrate on which a pad oxide layer and a first dielectric layer are formed in turn" in accordance with the embodiment of the present invention.

The present invention providing a method for fabricating a flash memory with recessed floating gates is described with reference to the accompanying drawings. To begin with, please refer to FIG. 9, there is provided a semiconductor substrate 100, on which a pad oxide layer 105 and a first dielectric layer 120 are formed in turn. The pad oxide layer 105 can be formed of a silicon oxide layer and can serve as a mask as well as a sacrificial layer during ion implantation. The first dielectric layer 120 can be formed of a silicon nitride layer to be 200 to 1200 Å in thickness.

Figure 10:
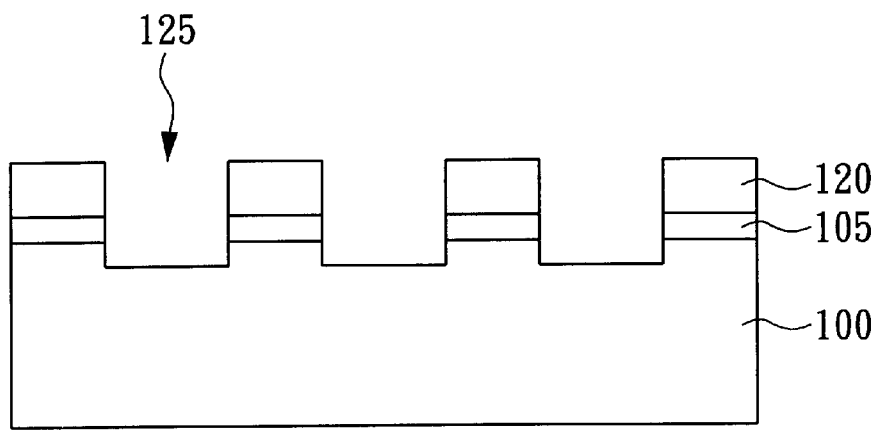
FIG. 10 schematically illustrates the step of "patterning said first dielectric layer by anisotropic etching, so as to form a plurality of trenches for recessed floating gates" in accordance with the embodiment of the present invention.

Next, the first dielectric layer 120 is patterned by using photolithography and anisotropic etching, so as to form a plurality of trenches 125 for recessed floating gates. It is noted that, in FIG. 10, there are shown the first dielectric layer 120, the pad oxide layer 105 and the semiconductor substrate 100. However, it is also feasible that only the first dielectric layer 120 is etched and patterned to form the trenches 125.

Figure 11:
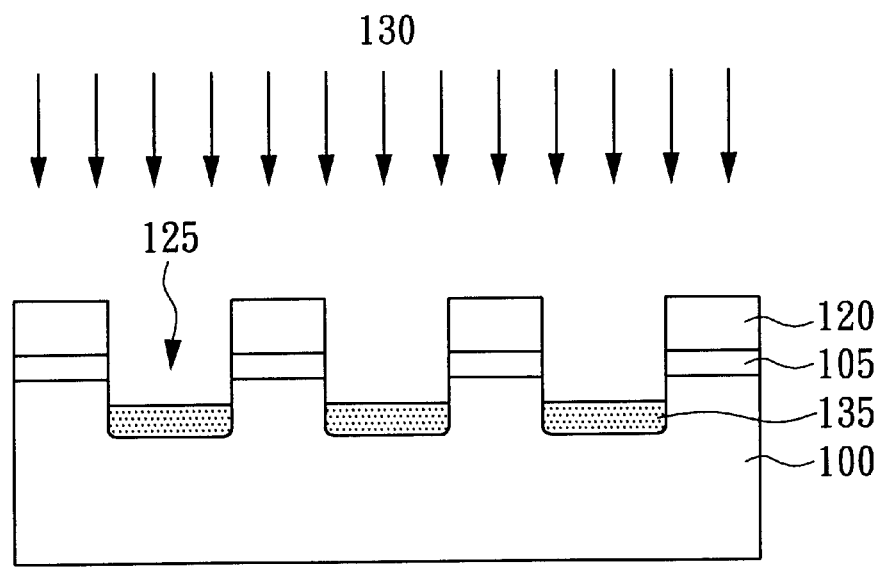
FIG. 11 schematically illustrates the step of "implanting ions into said semiconductor substrate, so as to define a plurality of bit line regions" in accordance with the embodiment of the present invention.

As shown in FIG. 11, ion implantation (as indicated by the arrows 130) is performed to implant ions into the semiconductor substrate 100, so as to define a plurality of bit line regions 135. The implanted ions can be n-type dopants such as $P^{3+}$ and $As^{3+}$.

Figure 12:
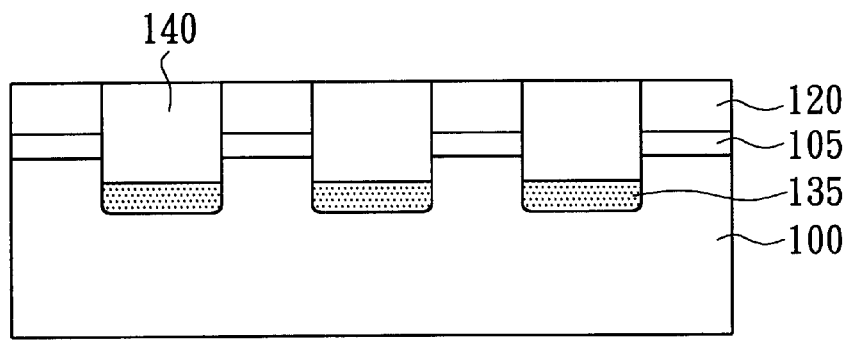
FIG. 12 schematically illustrates the step of "filling said plurality of trenches for recessed floating gates by depositing a second dielectric layer, which is to be planarized by chemical mechanical polishing (CMP)" in accordance with the embodiment of the present invention.

As shown in FIG. 12, a second dielectric layer 140 is deposited to fill the trenches 125 for recessed floating gates. Later, chemical mechanical polishing (CMP) is performed to planarize the second dielectric layer 140 while the first dielectric layer 120 serves as a polishing stop layer. The second dielectric layer 140 can be formed of a silicon oxide layer to be 500 to 3500 Å in thickness.

Figure 13:
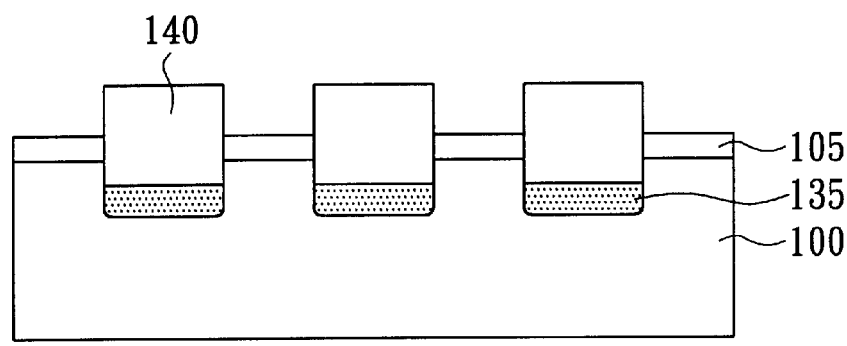
FIG. 13 schematically illustrates the step of "removing said first dielectric layer" in accordance with the embodiment of the present invention.
Figure 14:
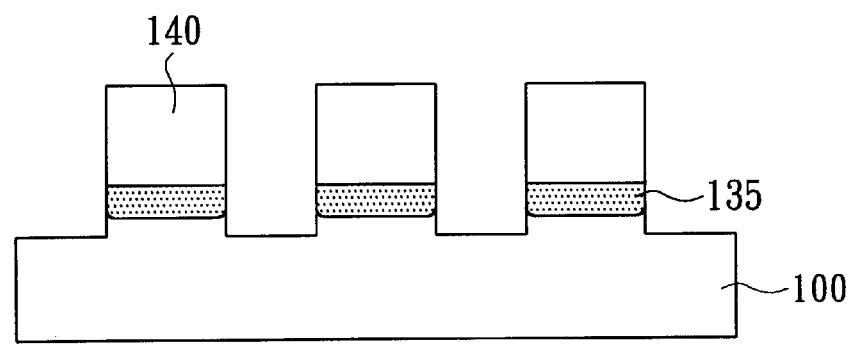
FIG. 14 schematically illustrates the step of "forming a plurality of trenches by etching by using said second dielectric layer as an etching mask" in accordance with the embodiment of the present invention.

As shown in FIG. 13, the first dielectric layer 120 is removed so that the second dielectric layer 140 stands out. Next, as shown in FIG. 14, the second dielectric layer 140 is used as an etching mask when plasma etching is performed to form a plurality of trenches (not shown).

Figure 15:
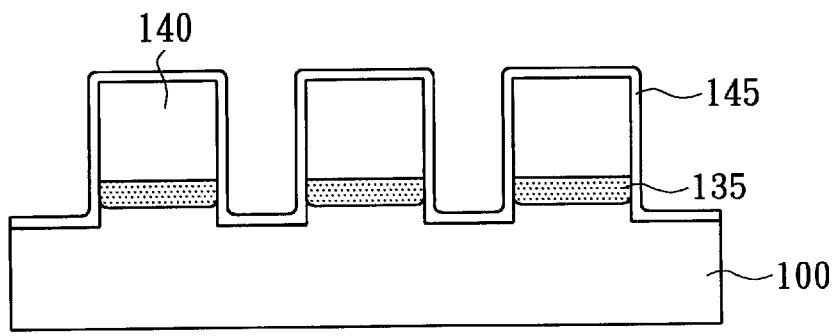
FIG. 15 schematically illustrates the step of "forming a tunnel dielectric layer on the top surface of said semiconductor substrate and said plurality of trenches" in accordance with the embodiment of the present invention.

As shown in FIG. 15, a tunnel dielectric layer 145 is formed on the top surface of the semiconductor substrate 100 and the trenches. The tunnel dielectric layer 145 is formed of a dielectric layer having a high dielectric constant, such as NO and ONO.

Figure 16:
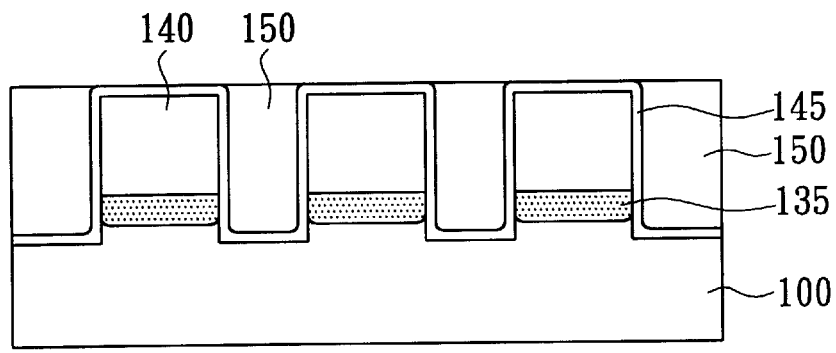
FIG. 16 schematically illustrates the step of "filling said plurality of trenches by depositing a first conductive layer, which is to be planarized by chemical mechanical polishing (CMP), so as to form recessed floating gates" in accordance with the embodiment of the present invention.

As shown in FIG. 16, a first conductive layer 150 is deposited to fill the trenches. Later, chemical mechanical polishing (CMP) is performed to planarize the first conductive layer 150 while the tunnel dielectric layer 145 serves as a polishing stop layer. The first conductive layer 150 can be formed of one of poly-silicon, metal silicide and amorphous silicon to be 500 to 4000 Å in thickness.

Figure 17:
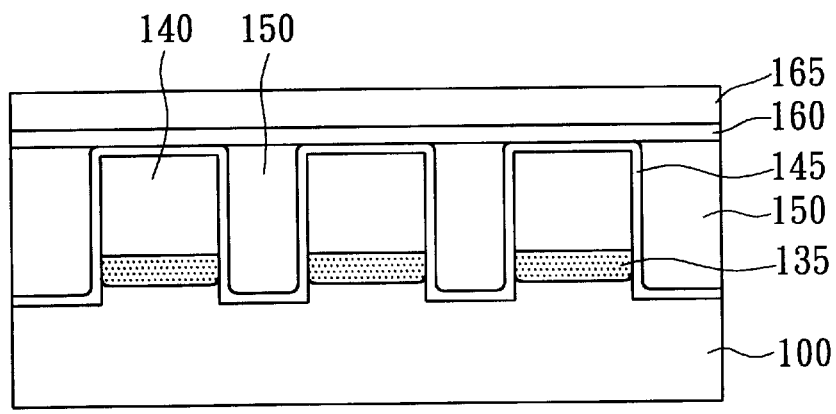
FIG. 17 schematically illustrates the step of "depositing a third dielectric layer and a second conductive layer, and patterning said second conductive layer, so as to form control gates" in accordance with the embodiment of the present invention.

Finally, as shown in FIG. 17, a third dielectric layer 160 and a second conductive layer 165 are deposited in turn. Later, the second conductive layer 165 is patterned, so as to form control gates (not shown). The second conductive layer 160 can be formed of one of poly-silicon, metal silicide and amorphous silicon to be 500 to 4000 Å in thickness.

As described above, the present invention provides a method for fabricating a flash memory with recessed floating gates. The present invention can do without the filed oxide layer so as to prevent the bird beak and form more reliable bit line regions.

The present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for fabricating a flash memory with recessed floating gates, comprising the steps of:
    (a) providing a semiconductor substrate, on which a pad oxide layer and a first dielectric layer are formed in turn;
    (b) patterning said first dielectric layer by anisotropic etching, so as to form a plurality of trenches for recessed floating gates;
    (c) implanting ions into said semiconductor substrate, so as to define a plurality of bit line regions;
    (d) filling said plurality of trenches for recessed floating gates by depositing a second dielectric layer, which is to be planarized by chemical mechanical polishing (CMP);
    (e) removing said first dielectric layer;
    (f) forming a plurality of trenches by etching by using said second dielectric layer as an etching mask;
    (g) forming a tunnel dielectric layer on the top surface of said semiconductor substrate and said plurality of trenches; and
    (h) filling said plurality of trenches by depositing a first conductive layer, which is to be planarized by chemical mechanical polishing (CMP), so as to form recessed floating gates.

2. The method for fabricating a flash memory with recessed floating gates as recited in claim 1, further comprising, after step (h), the steps of:
    (i) depositing a third dielectric layer;
    (j) depositing a second conductive layer; and
    (k) patterning said second conductive layer, so as to form control gates.

3. The method for fabricating a flash memory with recessed floating gates as recited in claim 1, wherein said first dielectric layer is formed of a silicon nitride layer into 200 to 1200 Å in thickness.

4. The method for fabricating a flash memory with recessed floating gates as recited in claim 1, wherein said second dielectric layer is formed of a silicon nitride layer to be 500 to 3500 Å in thickness.

5. The method for fabricating a flash memory with recessed floating gates as recited in claim 2, wherein said third dielectric layer is formed of a dielectric layer having a high dielectric constant, such as NO and ONO.

6. The method for fabricating a flash memory with recessed floating gates as recited in claim 1, wherein said tunnel dielectric layer is formed of a dielectric layer having a high dielectric constant, such as NO and ONO.

7. The method for fabricating a flash memory with recessed floating gates as recited in claim 1, wherein said first conductive layer and said second conductive layer are formed of one of poly-silicon, metal silicide and amorphous silicon.

8. The method for fabricating a flash memory with recessed floating gates as recited in claim 1, wherein said first conductive layer and said second conductive layer are formed to be 500 to 3500 Å in thickness.

9. The method for fabricating a flash memory with recessed floating gates as recited in claim 1, wherein in step (f) forming a plurality of trenches by etching is performed by plasma etching.

10. A method for fabricating a flash memory with recessed floating gates, comprising the steps of:
(a) providing a semiconductor substrate, on which a pad oxide layer and a first dielectric layer are formed in turn;
(b) patterning said first dielectric layer, said pad oxide layer and part of said semiconductor substrate by anisotropic etching, so as to form a plurality of trenches for recessed floating gates;
(c) implanting ions into said semiconductor substrate, so as to define a plurality of bit line regions;
(d) filling said plurality of trenches for recessed floating gates by depositing a second dielectric layer, which is to be planarized by chemical mechanical polishing (CMP);
(e) removing said first dielectric layer;
(f) forming a plurality of trenches by etching by using said second dielectric layer as an etching mask;
(g) forming a tunnel dielectric layer on the top surface of said semiconductor substrate and said plurality of trenches; and
(h) filling said plurality of trenches by depositing a first conductive layer, which is to be planarized by chemical mechanical polishing (CMP), so as to form recessed floating gates.

11. A method for fabricating a flash memory with recessed floating gates, comprising the steps of:
(a) providing a semiconductor substrate, on which a pad oxide layer and a first dielectric layer are formed in turn;
(b) patterning said first dielectric layer by anisotropic etching, so as to form a plurality of trenches for recessed floating gates;
(c) implanting ions into said semiconductor substrate, so as to define a plurality of bit line regions;
(d) filling said plurality of trenches for recessed floating gates by depositing a second dielectric layer, which is to be planarized by chemical mechanical polishing (CMP);
(e) removing said first dielectric layer;
(f) forming a plurality of trenches by etching by using said second dielectric layer as an etching mask;
(g) forming a tunnel dielectric layer on the top surface of said semiconductor substrate and said plurality of trenches; and
(h) filling said plurality of trenches by depositing a first conductive layer, which is to be planarized by chemical mechanical polishing (CMP), so as to form recessed floating gates.

12. The method for fabricating a flash memory with recessed floating gates as recited in claim 11, further comprising, after step (h), the steps of:
(i) depositing a third dielectric layer;
(j) depositing a second conductive layer; and
(k) patterning said second conductive layer, so as to form control gates.

13. The method for fabricating a flash memory with recessed floating gates as recited in claim 11, wherein said first dielectric layer is formed of a silicon nitride layer into 200 to 1200 Å in thickness.

14. The method for fabricating a flash memory with recessed floating gates as recited in claim 11, wherein said second dielectric layer is formed of a silicon nitride layer to be 500 to 3500 Å in thickness.

15. The method for fabricating a flash memory with recessed floating gates as recited in claim 12, wherein said third dielectric layer is formed of a dielectric layer having a high dielectric constant, such as NO and ONO.

16. The method for fabricating a flash memory with recessed floating gates as recited in claim 11, wherein said tunnel dielectric layer is formed of a dielectric layer having a high dielectric constant, such as NO and ONO.

17. The method for fabricating a flash memory with recessed floating gates as recited in claim 11, wherein said first conductive layer and said second conductive layer are formed of one of poly-silicon, metal silicide and amorphous silicon.

18. The method for fabricating a flash memory with recessed floating gates as recited in claim 11, wherein said first conductive layer and said second conductive layer are formed to be 500 to 3500 Å in thickness.

19. The method for fabricating a flash memory with recessed floating gates as recited in claim 11, wherein in step (f) forming a plurality of trenches by etching is performed by plasma etching.

* * * * *